United States Patent
Loebl et al.

(10) Patent No.: US 7,982,214 B2
(45) Date of Patent: Jul. 19, 2011

(54) VOLTAGE-OPERATED LAYERED ARRANGEMENT

(75) Inventors: Hans-Peter Loebl, Monschau-Imgenbroich (DE); Herbert Friedrich Boerner, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 225 days.

(21) Appl. No.: 12/517,808

(22) PCT Filed: Dec. 7, 2007

(86) PCT No.: PCT/IB2007/054965
§ 371 (c)(1),
(2), (4) Date: Jun. 5, 2009

(87) PCT Pub. No.: WO2008/072148
PCT Pub. Date: Jun. 19, 2008

(65) Prior Publication Data
US 2010/0327309 A1  Dec. 30, 2010

(30) Foreign Application Priority Data
Dec. 12, 2006 (EP) .................................. 06125859

(51) Int. Cl.
*H01L 21/00* (2006.01)

(52) U.S. Cl. ............... 257/40; 257/43; 257/79; 257/89; 257/99; 257/103; 257/E21.102; 257/E25.008; 257/E31.125; 257/E33.004; 438/57; 438/63; 438/82

(58) Field of Classification Search ............... 257/40, 257/43, 79, 89, 98, 99, 103, 189, E21.102, 257/25.008, 31.125, 33, 4, 51.001, 18, 22; 438/57, 63, 82
See application file for complete search history.

(56) References Cited

U.S. PATENT DOCUMENTS

| | | | |
|---|---|---|---|
| 5,505,985 A | 4/1996 | Nakamura et al. | |
| 6,262,441 B1 * | 7/2001 | Bohler et al. | 257/103 |
| 6,372,154 B1 * | 4/2002 | Li | 252/301.16 |
| 6,472,804 B2 * | 10/2002 | Mueller et al. | 313/326 |
| 6,515,314 B1 * | 2/2003 | Duggal et al. | 257/184 |
| 6,798,133 B1 * | 9/2004 | Ambrugger et al. | 313/498 |
| 6,806,491 B2 * | 10/2004 | Qiu et al. | 257/40 |
| 6,865,010 B2 * | 3/2005 | Duthaler et al. | 359/296 |
| 6,952,079 B2 * | 10/2005 | Shiang et al. | 313/506 |
| 7,002,293 B2 * | 2/2006 | Madathil et al. | 313/504 |
| 7,156,942 B2 * | 1/2007 | McCormick et al. | 156/249 |
| 7,161,171 B2 * | 1/2007 | Dahmani et al. | 257/40 |
| 7,192,657 B2 * | 3/2007 | Roberts et al. | 428/690 |
| 7,274,501 B2 * | 9/2007 | McCabe et al. | 359/265 |
| 7,317,566 B2 * | 1/2008 | Tench et al. | 359/265 |
| 7,511,417 B2 * | 3/2009 | Chang et al. | 313/504 |
| 7,560,747 B2 * | 7/2009 | Cok | 257/98 |

(Continued)

FOREIGN PATENT DOCUMENTS

| | | |
|---|---|---|
| EP | 1403908 A2 | 3/2004 |
| EP | 1403939 A1 | 3/2004 |
| EP | 1489889 A1 | 12/2004 |
| EP | 2009060 A1 | 12/2008 |
| WO | 2005099311 A1 | 10/2005 |

*Primary Examiner* — Michael S Lebentritt

(57) ABSTRACT

A voltage-operated layered arrangement comprising a substrate (1), a layered structure (2, 3, 4, 5) that is applied to the substrate and that comprises at least one electrically conductive functional layer (3) arranged between a first electrode (2) and a second electrode (4), and a field-degrading layer (5) that is less electrically conductive than the functional layer (3) and that is applied to the second electrode (4) arranged on the side of the layered structure remote from the substrate in such a way that it covers the second electrode (4) at least in the region of an edge (4a) and connects the second electrode (4) to the first electrode (2) electrically.

10 Claims, 1 Drawing Sheet

U.S. PATENT DOCUMENTS

| | | | |
|---|---|---|---|
| 7,625,523 B2 * | 12/2009 | Ito | 420/555 |
| 7,646,144 B2 * | 1/2010 | Cok | 313/503 |
| 7,682,864 B2 * | 3/2010 | Shen et al. | 438/82 |
| 2002/0074938 A1 | 6/2002 | Gu | |
| 2004/0099862 A1 | 5/2004 | Suzuki et al. | |
| 2004/0256980 A1 | 12/2004 | Tsuchiya | |
| 2005/0026316 A1 | 2/2005 | Kidokoro et al. | |
| 2005/0269946 A1 | 12/2005 | Jeong et al. | |

* cited by examiner ial layer that is arranged between an anode and a cathode
VOLTAGE-OPERATED LAYERED ARRANGEMENT The invention relates to a voltage-operated layered arrangement having a functional layer, and covering layers for the electrical passivation of the layered arrangement, and to a method of producing a layered arrangement of this kind.

BACKGROUND OF THE INVENTION

There is a large number of known voltage-operated layered arrangements comprising a plurality of thin layers or thin films including a functional layer for applying an operating voltage, such for example as computer chips, thin-film components or electroluminescent arrangements having inorganic or organic electroluminescent layers. These layered arrangements comprise a layered structure having a functional layer that is arranged between an anode and a cathode for applying an operating voltage across the functional layer. The functional layers are intended for example for the emission of light, as thin-film resistors, as dielectric layers, or for use in other applications. The layered structure is typically applied to a substrate. The typical thicknesses of the layered structure may vary between a few 100 nms and a few tens of μms. The typical voltages applied to the functional structure are between a few volts and a few tens of volts. Leakage currents or short circuits between the cathode and anode have an adverse effect on the operation and life of a layered arrangement of this kind. Depending on the strength and duration of the leakage current and/or short circuit, it is even possible for a layered arrangement of this kind to be destroyed. The occurrence of leakage currents or short circuits is encouraged by edges that exist due to the structuring of the layered structure, and by the related increase in the electrical field in the region of the edges.

Document U.S. Pat. No. 5,505,985 discloses an organic LED having a protective layer of an electrically insulating material. The material of the protective layer is suitable particularly for preventing moisture from diffusing into the layers situated below it. The application of the protective layer preferably takes place in a vacuum because the intention is to stop the protective layer from attacking either the organic luminescent layer or the electrode adjacent the protective layer in the course of the application process. The electroluminescent arrangements that have protective layers of this kind show a smaller reduction in brightness relative to the initial brightness than electroluminescent arrangements not having such a protective layer. However, the very much increased local electrical field that exists in the region of sharp edges remains unaffected by an electrically insulating protective layer. This increased electrical field causes a very much increased flow of current locally and this results in local degradation of the functional layer arranged between the anode and cathode, one development of which may, when the time in operation becomes fairly long, be a short circuit.

SUMMARY OF THE INVENTION

It is therefore an object of this invention to make a long life possible for structured layered arrangements.

This object is achieved by a voltage-operated layered arrangement comprising a substrate, a layered structure that is applied to the substrate and that comprises at least one electrically conductive functional layer arranged between a first electrode and a second electrode, and a field-degrading layer that is less electrically conductive than the functional layer and that is applied to the second electrode arranged on the side of the layered structure remote from the substrate in such a way that it covers the second electrode at least in the region of an edge and connects the second electrode to the first electrode electrically.

By the application of the field-degrading layer in the region of an edge, the local increase in the electrical field at the edge is considerably reduced. The electrical conductivity of the field-degrading layer produces a wider distribution of the field in the region of sharp edges because the field, which previously originated only from the edge, now extends into the functional layer via the adjoining regions of the field-degrading layer as well. Hence, what flows through the functional layer in this area is a current that is only slightly higher than the current in regions where there are no edges, which produces a dramatic reduction in the risk of short circuits in the area in question. Because the conductivity of the field-degrading layer is less than the conductivity of the functional layer, the possibility of a short circuit between the anode and cathode via the field-degrading layer is ruled out.

In one embodiment of the voltage-operated layered arrangement according to the invention, the functional layer comprises at least one electroluminescent layer. In this case, locally increased field strengths in the region of edges make themselves apparent in the form of degradation of the electroluminescent layer around the edges. The degenerated regions may possibly cease to emit light and may grow and, as the time in operation becomes longer, may result in a short circuit that will cause the entire electroluminescent layer to fail. The presence of the field-degrading layer will prevent any substantial increase in the field in the region of the edges and the regions that emit poorly or not at all will thus not grow nor will they pose any threat to the emitting ability of the electroluminescent layer.

In a further embodiment, the electroluminescent layer comprises an organic electroluminescent material. In this embodiment, as well as providing the advantages detailed above, the degradation layer constitutes, in addition, a protective layer that is at least an obstacle to the permeation of moisture or oxygen into the organic layer and that has a beneficial effect on the stability of its emitting ability as far as ambient factors are concerned.

In a further arrangement, the field-degrading layer has an electrical resistance of between 1 $\Omega$cm and $10^8$ $\Omega$cm, and preferably of between $10^2$ $\Omega$cm and $10^8$ $\Omega$cm, and as a particular preference of between $10^4$ $\Omega$cm and $10^8$ $\Omega$cm, and even more preferably of between $10^6$ $\Omega$cm and $10^8$ $\Omega$cm. With a resistance of this range of values, the field-distributing effect of the field-degrading layer is particularly effective and at the same time the possibility of a short circuit between the anode and cathode is ruled out. It is advantageous in this case if the thickness of the field-degrading layer is less than 200 nm.

In a further arrangement, the field-degrading layer comprises at least one material from the group comprising the inorganic semiconductors, the organic conductive polymers and small conductive organic molecules. These materials are easy to apply as homogeneous layers, and if required as mixed layers, and have uniform electrical properties. The field-distributing effect is thus not subject to local variations in a voltage-operated layered arrangement of large area and can be set repeatably. These materials thus differ, markedly for example, from polymers doped with metallic particles, where variations in the doping concentration could result in widely differing field-degrading properties. The variations in the particle concentration could for example be the result of agglomeration of the particles, particularly if the concentration were to be close to the percolation threshold.

In this case, the inorganic semiconductor may be, in one embodiment, sub-stoichiometric $SiN_x$ where $0.1<x<0.8$, titanium oxinitride, or non-stoichiometric $TiO_y$, where $0<y<2$. In another embodiment, the organic conductive polymer may be doped PDOT, PANI or polyaniline. In a further embodiment, the small conductive organic molecules may be at least one material from the group comprising MTDATA doped with F4TCNQ, vanadyl phthalocyanine doped with F4TCNQ, C60 fullerene doped with LVC or C60 fullerene doped with pyB.

The invention also relates to a method of producing a voltage-operated layered arrangement as claimed in claim 1, comprising the steps of
applying a first electrode to a substrate,
applying an electrically conductive functional layer,
applying a second electrode, and
applying a field-degrading layer (5) to cover the second electrode (4) at least in the region of an edge (4a) and to make electrical contact with the first electrode (2).

BRIEF DESCRIPTION OF THE DRAWINGS

These and other aspects of the invention are apparent from and will be elucidated with reference to the embodiments described hereinafter.

In the drawings.

DESCRIPTION OF PREFERRED EMBODIMENTS

Figure 1:
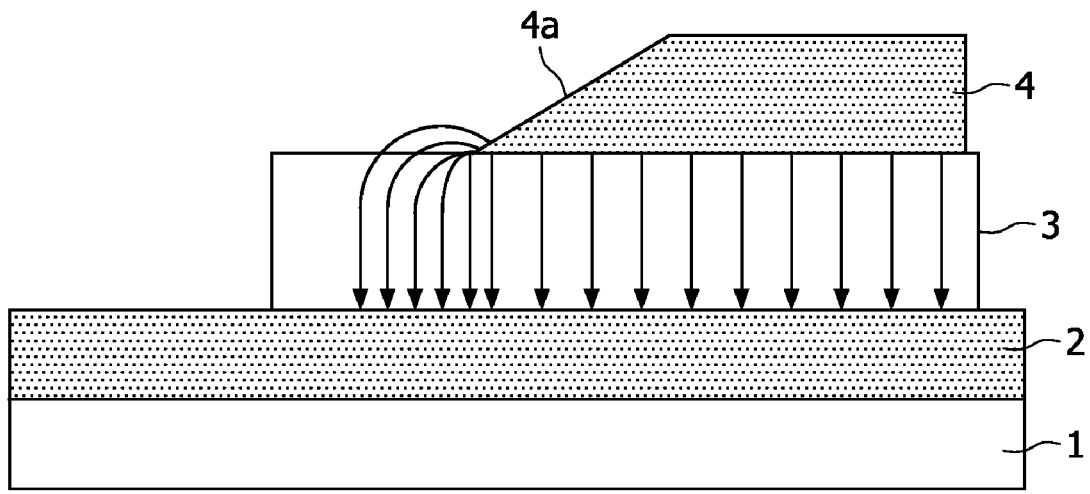
FIG. 1 is a view from the side of a voltage-operated layered arrangement in the region of an edge.

A voltage-operated layered arrangement of the kind shown in FIG. 1, such for example as an organic electroluminescent arrangement (OLED), comprises individual thin layers the majority of which are produced by dry directional coating processes such for example as vacuum deposition and/or sputtering. What is referred to as a directional coating process is a process in which the material to be applied moves substantially in a straight line from the source to the substrate to be coated. A characteristic of such processes is uncoated regions (shadowed regions) which are situated behind edges, masks, etc. arranged in the region of space between the source and substrate. In such directional coating processes, edges occur as a result of, for example, the structuring of the layered arrangement by masking techniques.

For an OLED arrangement, a typical operating voltage is of the order of 3 to 10 V between the electrodes 2 and 4. With a typical electrode spacing of 100 nm, that corresponds to a field of 30-100 kV/mm between the electrodes 2 and 4. The electrical field is represented in FIG. 1 by arrows running from the cathode 4 to the anode 2. The edge 4a in the electrode layer 4, which is arranged on the side of the layered structure remote from the substrate, produces, due to the small radius of curvature of the edge 4a, field strengths that are substantially higher locally. The increase in the field is represented in FIG. 1 by the more closely spaced arrows in the region of the edge 4a. A leakage current and/or a flashover between the cathode 4 and the anode 2 gives rise to an uncontrolled flow of current. This process, which is generally self-amplifying over the period covered by the flow of current, results in the destruction of the layered arrangement. The occurrence of this process in OLED arrangements for example is not dependent on whether, depending on the form of layered structure, there is one or more than one organic layer 3 between the anode 2 and cathode 4.

Figure 2:
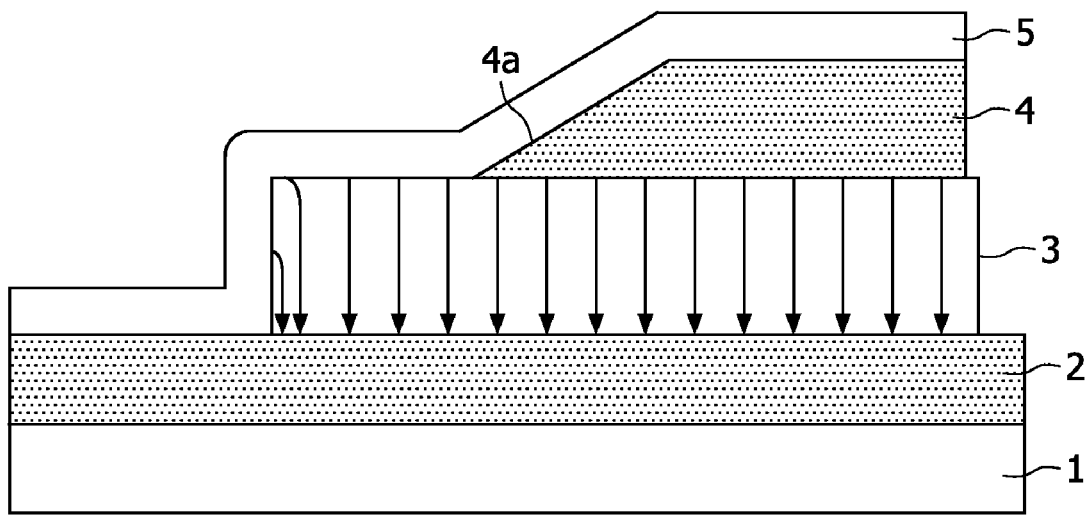
FIG. 2 is a view from the side of a voltage-operated layered arrangement according to the invention in the region of the edge.

A field-degrading layer within the voltage-operated layered arrangement according to the invention represents an effective and inexpensive solution to the problem of preventing a substantial increase in the field in the region of an edge. In this case, if there were no field-degrading layer, the increase in the field would be all the greater the sharper was the edge. FIG. 2 is a view from the side of a voltage-operated layered arrangement according to the invention having a field-degrading layer 5, which is taken as an example being an organic electroluminescent arrangement (OLED). The layered structure of the OLED includes an organic functional layer 3 that may, in many designs, comprise a plurality of organic sub-layers. An embodiment of an OLED of this kind comprises for example, as the functional layer 3, doped tris (8-hydroxyquinolinato)aluminum of a typical thickness in the 100 nm range, which is arranged between two electrodes 2 and 4 (such for example as a first electrode forming an anode 2 and a second electrode forming a cathode 4) of which at least one is transparent. What is usually used as a transparent conductive material is indium tin oxide (ITO). Serving as the non-transparent electrode is conductive material, usually a layer of metal, of a thickness of the order of 100 nm. There are however also arrangements in which both electrodes are transparent. The layered structure is applied to a substrate 1. The electroluminescent light emitted by the organic functional layer 3 is usually emitted through the substrate 1. When this is the case the anode 2 comprises a layer of ITO and the cathode 4 a layer of aluminum. The layered structure may also be applied to the substrate in the reverse sequence. When emission is towards the side remote from the substrate, the field-degrading layer 5 has to be transparent. Arranged between the organic functional layer 3 and the anode 2 there is generally a hole-conducting layer, typically of alpha-NPD (N,N'-di(napththalen-2-yl)-N,N'-diphenyl benzidine) of a thickness of approx. 50 nm. Between the cathode 4 and the organic functional layer 3 is usually situated a thin electron injection layer of a material having a low work function, such as lithium, cesium or barium, which work function is important to give good injection of the electrons into the luminescent layer. For chemical passivation against ambient factors, and particularly moisture and oxygen, the voltage-operated layered arrangement may also be enclosed by an encapsulating arrangement.

The field-degrading layer 5 and its electrical conductivity, which is of a suitable order of magnitude, causes the electrical field to be distributed away from the sharp edge 4a and into the field-degrading layer 5, as can be seen in FIG. 2 from the arrows. As in FIG. 1, the arrows represent the electrical field between the cathode 4 and anode 2. The homogeneous electrical field in the regions of the layered structure where there is not an edge is presented by arrows whose spacing is constant. Because of the field-distributing effect of the electrically conductive field-degrading layer 5, this spacing is largely maintained even in the region of the edge 4a, which means that no increase in the field is caused in the region of the sharp edge 4a (in complete contrast to FIG. 1 where there is no field-degrading layer 5) and there is thus also no local increase in the flow of current. The properties of the functional layer 3 are thus not disrupted by an excessive flow of current and are maintained over the operating life to the same extent as is the case in the regions where there is no edge 4a. However, the electrical resistance of the field-degrading layer 5 should be sufficiently high in this case to prevent a short circuit between the electrodes 2 and 4 through the field-degrading layer 5. Values of resistance that are particularly suitable for the field-degrading layer are between 1 Ωcm and $10^8$ Ωcm, and preferably between $10^2$ Ωcm and $10^8$ Ωcm, and as a particular preference between $10^4$ Ωcm and $10^8$ Ωcm, and even more preferably between $10^6$ Ωcm and $10^8$ Ωcm. With a resistance of this range of values, the field-distributing effect of the field-degrading layer is particularly effective. It is advantageous in this case if the thickness of the field-degrading layer is less than 200 nm.

The embodiment shown in FIG. 2 is only one example of voltage-operated layered arrangements. For non-optical applications, layer properties such as transparency and/or reflectivity are of no significance. For other applications, the layer sequence and the materials of the layers may be partly or entirely different than the layer sequence and layer material shown in FIG. 1. However, all voltage-operated applications are affected by the same problem that, during the production process, a structured layered structure may produce, within the layered structure between the cathode and anode, a leakage current and/or a short circuit and may then cause the voltage-operated layered arrangement to fail.

Suitable materials for the field-degrading layer 5 are for example inorganic semiconductors such as sub-stoichiometric $SiN_x$ where $0.1<x<0.8$, titanium oxinitride, or non-stoichiometric $TiO_y$ where $0<y<2$, or organic conductive polymers such as doped PDOT, PANI or polyaniline, small conductively doped organic molecules such for example as MTDATA or vanadyl phthalocyanine doped with F4TCNQ, or similar systems, and/or C60 fullerene doped with, for example, LVC or pyB, or mixtures of the materials specified above. Electrical conductivity can be set over a wide range in these materials and can be adjusted in this way to suit the requirements of the particular layered structure with regard to operating voltage.

For example, 200 nm thick layers of $SiN_x$ where the range is $0.1<x<0.8$ have values of resistance from 20 Ωcm to $2*10^6$ Ωcm. Layers of titanium oxinitride for example, of a thickness of 300 nm, have values of resistance that can be set over a wide range by way of the oxygen/nitrogen ratio, these values being between $3*10^{-6}$ Ωcm for titanium nitride and $3*10^7$ Ωcm for $TiO_y$ where $0<y<2$. With a suitable oxygen/nitrogen ratio, values of resistance of between 1 Ωcm and $3*10^7$ Ωcm are obtained. In the case of vanadyl phthalocyanine doped with F4TCNQ, the value of resistance can be set at between $10^2$ Ωcm and $10^6$ Ωcm for doping ratios from 1:10 to 1:1000. Doped PDOT has a resistance of between 1 Ωcm and $10^4$ Ωcm at a layer thickness of 200 nm. A suitable dopant for PDOT would for example be PPS. As well as the level of doping, resistance is also a function of the thickness of the layer.

The voltage-operated layered arrangement according to the invention can be produced by directional and/or non-directional coating processes. A first electrode 2 is first applied to a substrate 1. The functional layer 3 and the second electrode 4 are then applied to the first electrode 2. Structuring processes, such as masking techniques or etching techniques for example, give rise to sharp edges in, for example, the second electrode 4. The field-degrading layer 5 is then applied over the second electrode 4 by means of directional coating processes, such for example as sputtering or vapor deposition, or non-directional coating processes such for example as OPVD, printing processes, or coating processes using linear sources. By the latter processes in particular, the material of the field-degrading layer 5 is deposited in a layer of adequate thickness even, in particular, in the region of the edges, electrical contact thus being made between the two electrodes 2 and 4 via the field-degrading layer 5.

What is meant by OPVD is "organic vapor phase deposition". In this, the material to be applied is conveyed to the substrate in a flow of gas at low pressure (approx. 0.1 mbar) and high temperature (approx. 300° C.).

By "linear sources" is meant vacuum coating systems in which a plurality of vaporizer sources are arranged next to one another and close together in a line, the substrate being passed transversely across this line of vaporizers.

Non-directional coating processes avoid any shadowing (regions of the substrate which are not coated due to shading off of the material to be applied by objects, such as particles, that are positioned in a direct line between the source and the substrate) such for example as by dust particles 6.

What are needed for a continuous electrically conductive field-degrading layer 5 are layer thicknesses of at least 5 nm. Any adhesion problems that may occur or excessively long times taken to apply layers can be avoided if the thickness of the field-degrading layer is not more than 200 nm.

This method of distributing the field by applying a field-degrading layer 5 does not depend on the nature of the use made of the functional layer 3, be it as a light source or for other purposes.

The embodiments that have been elucidated by reference to the drawings and in the description are merely examples of the distribution of the electrical field in a voltage-operated layered arrangement and are not to be construed as limiting the claims to these examples. For the person skilled in the art there are also alternative embodiments for other applications that are possible for other voltage-operated layered arrangements having functional layers and these too are covered by the scope of protection afforded by the claims. The numbering of the dependent claims is not intended to imply that other combinations of the claims do not also define advantageous embodiments of the invention.

The invention claimed is:

1. A voltage-operated layered arrangement comprising a substrate (1),
a layered structure (2, 3, 4, 5) that is applied to the substrate and that comprises at least one electrically conductive functional layer (3) arranged between a first electrode (2) and a second electrode (4), and
a field-degrading layer (5) that is less electrically conductive than the functional layer (3) and that is applied to the second electrode (4) arranged on the side of the layered structure remote from the substrate in such a way that it covers the second electrode (4) at least in the region of an edge (4a) and connects the second electrode (4) to the first electrode (2) electrically.

2. A voltage-operated layered arrangement as claimed in claim 1, wherein the functional layer comprises at least one electroluminescent layer.

3. A voltage-operated layered arrangement as claimed in claim 2, wherein the electroluminescent layer comprises an organic electroluminescent material.

4. A voltage-operated layered arrangement as claimed in claim 1, wherein the field-degrading layer has an electrical resistance of between 1 Ωcm and $10^8$ Ωcm.

5. A voltage-operated layered arrangement as claimed in claim 1, wherein the thickness of the field-degrading layer is less than 200 nm.

6. A voltage-operated layered arrangement as claimed in claim 4, wherein the field-degrading layer comprises at least one material selected from the group consisting of: the inorganic semiconductors, the organic conductive polymers and the small conductive organic molecules.

7. A voltage-operated layered arrangement as claimed in claim 6, wherein the inorganic semiconductor is sub-stoichiometric $SiN_x$ where $0.1<x<0.8$, titanium oxinitride, or non-stoichiometric $TiO_y$ where $0<y<2$.

8. A voltage-operated layered arrangement as claimed in claim 6, wherein the organic conductive polymers are doped PDOT, PANI or polyaniline.

9. A voltage-operated layered arrangement as claimed in claim 6, wherein the small conductive organic molecules comprise at least one material selected from the group consisting of: MTDATA doped with F4TCNQ, vanadyl phthalocyanine doped with F4TCNQ, C60 fullerene doped with LVC and C60 fullerene doped with pyB.

10. A method of producing a voltage-operated layered arrangement as claimed in claim 1, comprising the steps of
applying a first electrode (2),
applying an electrically conductive functional layer (3),
applying a second electrode (4),
applying a field-degrading layer (5) to cover the second electrode (4) at least in the region of an edge (4a) and to make electrical contact with the first electrode (2).

* * * * *